United States Patent
Bianco et al.

(10) Patent No.: US 9,164,138 B2
(45) Date of Patent: Oct. 20, 2015

(54) ELECTRIC VEHICLE SERVICE EQUIPMENT TESTER

(71) Applicants: James S. Bianco, Suffield, CT (US); James T. Madsen, Somers, CT (US)

(72) Inventors: James S. Bianco, Suffield, CT (US); James T. Madsen, Somers, CT (US)

(73) Assignee: Control Module, Inc., Enfield, CT (US)

( * ) Notice: Subject to any disclaimer, the term of this patent is extended or adjusted under 35 U.S.C. 154(b) by 422 days.

(21) Appl. No.: 13/627,470

(22) Filed: Sep. 26, 2012

(65) Prior Publication Data

US 2013/0076368 A1 Mar. 28, 2013

Related U.S. Application Data

(60) Provisional application No. 61/539,682, filed on Sep. 27, 2011.

(51) Int. Cl.
*H02J 7/00* (2006.01)
*G01R 21/00* (2006.01)
*G01R 31/00* (2006.01)

(52) U.S. Cl.
CPC .................................. *G01R 31/00* (2013.01)

(58) Field of Classification Search
CPC ....................................................... G01R 31/00
USPC ...................... 320/109, 137; 324/510; 702/60
See application file for complete search history.

(56) References Cited

U.S. PATENT DOCUMENTS

| | | | |
|---|---|---|---|
| 5,646,507 A * | 7/1997 | Timmons et al. | 320/149 |
| 2011/0193411 A1* | 8/2011 | Lam et al. | 307/35 |
| 2012/0286729 A1* | 11/2012 | Yegin et al. | 320/109 |

* cited by examiner

*Primary Examiner* — Jermele M Hollington
*Assistant Examiner* — Farhana Hoque
(74) *Attorney, Agent, or Firm* — Alix, Yale & Ristas, LLP

(57) ABSTRACT

A tester connects with the connector of electrical vehicle service equipment (EVSE). The tester simulates the battery supply of an electric vehicle to test whether the EVSE is properly operating without requiring that the electric vehicle be present. In one embodiment LEDs are employed to indicate whether the EVSE meets specifications. In a second embodiment various measurements of voltage levels and signals are provided to allow for a more detailed analysis of the performance characteristics of the EVSE. Ground fault, proximity sensor, and re-closure tests are also undertaken.

20 Claims, 16 Drawing Sheets

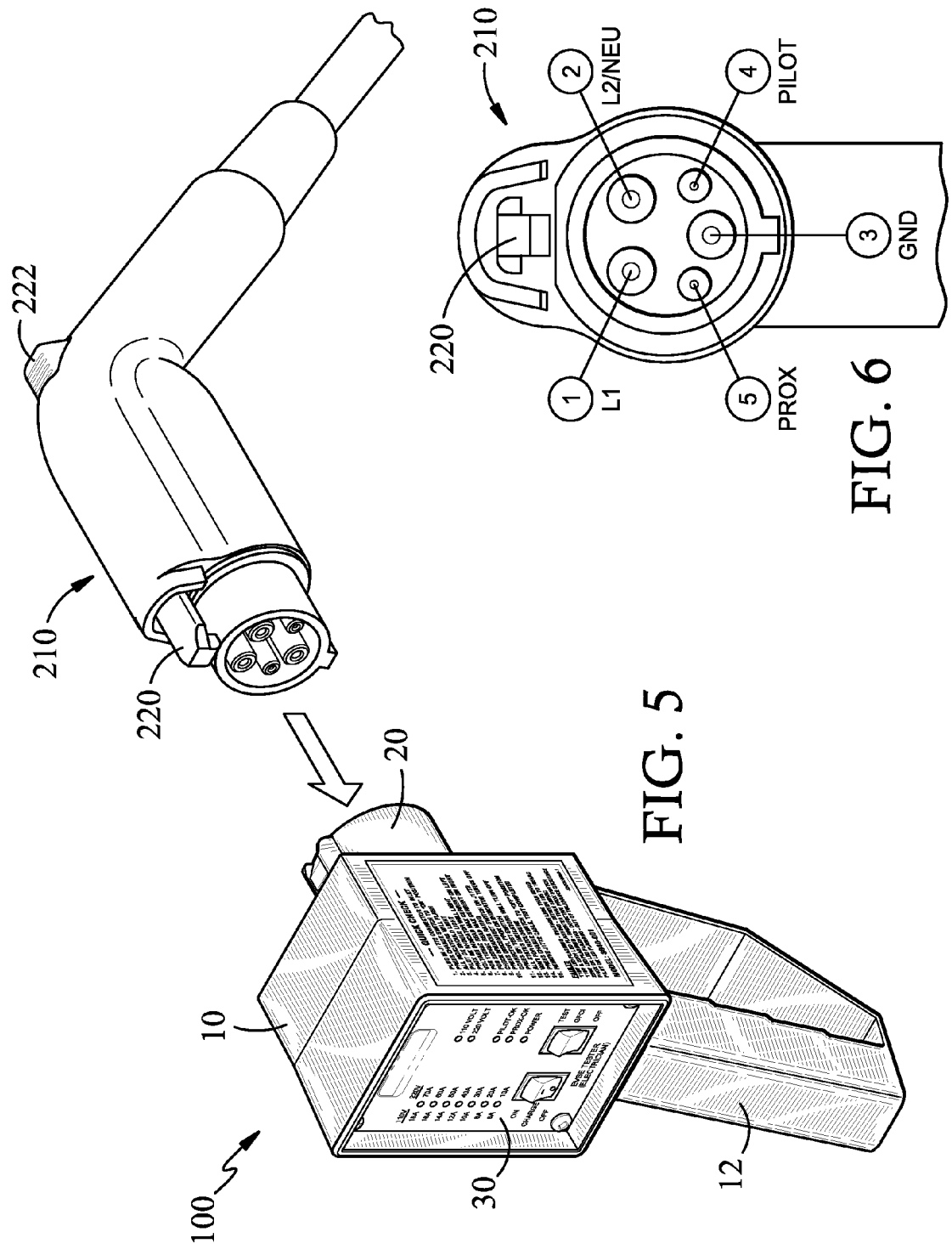

| 110VAC Current Displayed | Min Breaker Size |
| --- | --- |
| 18A | 25A |
| 16A | 20A |
| 14A | 20A |
| 12A | 15A |
| 10A | 15A |
| 8A | 15A |
| 6A | 15A |

FIG. 8

| 220VAC Current Displayed | Min Breaker Size |
| --- | --- |
| 70A | 100A |
| 60A | 80A |
| 50A | 65A |
| 40A | 50A |
| 30A | 40A |
| 20A | 25A |
| 10A | 15A |

FIG. 9

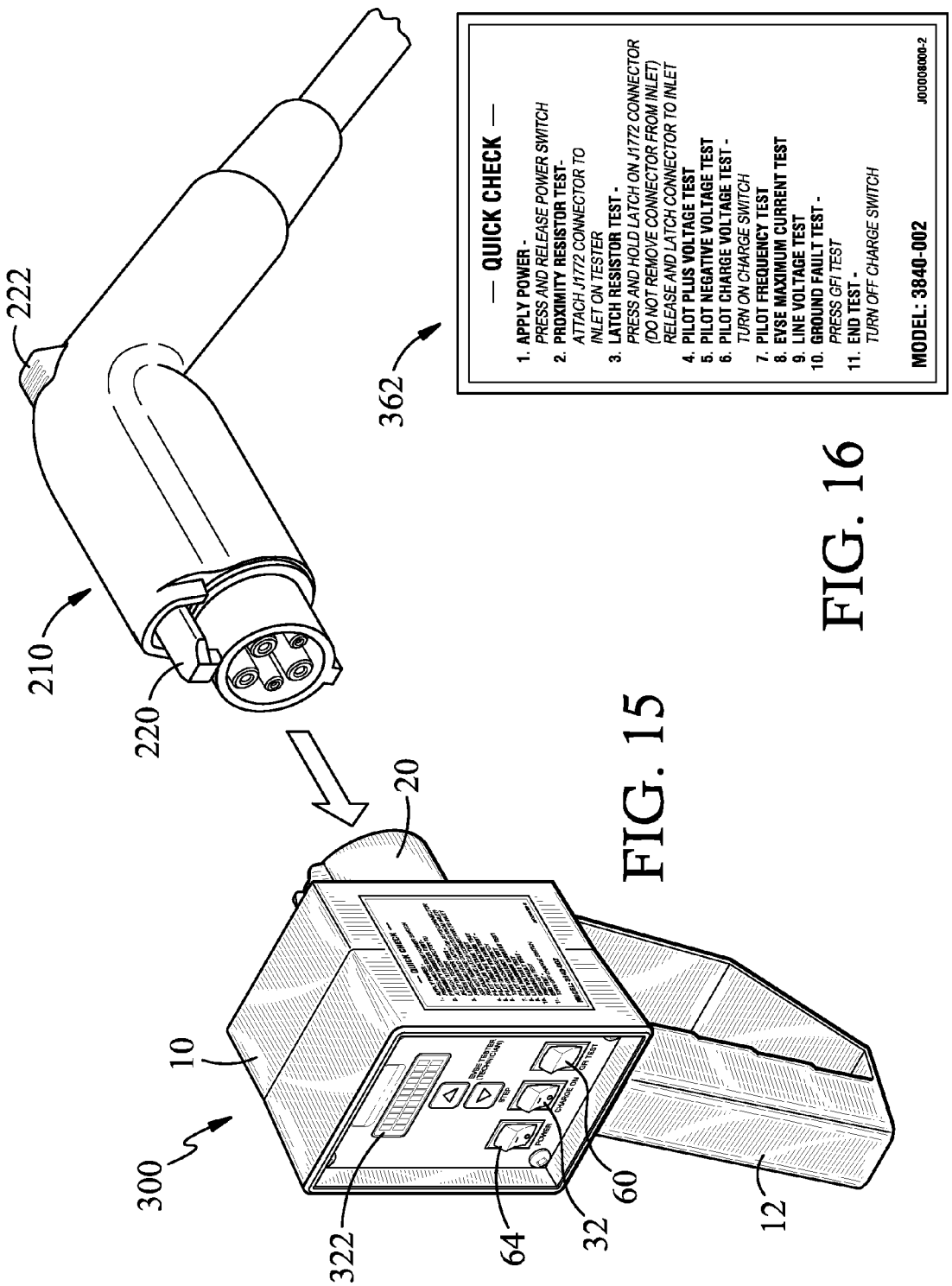

ELECTRIC VEHICLE SERVICE EQUIPMENT TESTER

CROSS-REFERENCE TO RELATED APPLICATION

This application claims the priority of U.S. Provisional Patent Application No. 61/539,682 filed on Sep. 27, 2011, the disclosure of which is incorporated by reference in its entirety.

BACKGROUND

This disclosure relates generally to electric vehicle service equipment (EVSE) employed for charging the battery power supply of an electric vehicle. More particularly, this disclosure relates to devices and methods for installing EVSE in connection with residential installations.

The increased popularity of electric vehicles has been coupled with the increased numbers of installations of EVSE to provide charging terminals. The installation of EVSE typically requires the services of an electrician to ensure that the EVSE is operating properly and that the EVSE installation is safe.

Standards have been adopted by The Society of Automotive Engineers (SAE) and various governmental and professional organizations for providing a standard electrical connection and protocol between the land based electrical power supply and the battery charging unit of the electrical vehicle. This is typically implemented in the form of J1772 connectors.

When installing an EVSE, it is necessary to test the unit, to ensure its proper performance, before connecting to an electric vehicle. An installer typically will not have access to an electric vehicle, and it is recommended to use the electric vehicle as a tester. Therefore, there is a need for an EVSE tester that is portable and easy to use that tests all operating and safety functions of a newly installed EVSE. There is also a need for a tester that not only tests the operation and safety functions, but will also display the various performance values when the EVSE fails the "go/no go" requirements.

This disclosure pertains to two such tester devices. The first device is a go/no go tester to simply determine if the EVSE is performing within specifications. The second device is not only used to test the EVSE, but to display the values of each test to better determine the root cause of a failure.

SUMMARY

Briefly stated, a tester for electric vehicle service equipment (EVSE) for charging the battery power supply of an electric vehicle comprises a housing with control panel at an exterior location of the housing. The control panel comprises a switch and a plurality of indicators. An EVSE connector inlet is disposed for access exteriorly of the housing. Circuitry comprising a microprocessor is disposed in the housing and in communication with the inlet, the switch and the indicators. Upon connecting an EVSE connector to the inlet and activating the switch to an "On" mode, the circuitry simulates the battery power supply of an electric vehicle and activates indicators indicative of performance characteristics of the EVSE.

The performance characteristics comprise at least one characteristic selected from the group consisting of a signal level, a voltage level and a pulse width. The control panel is disposed generally opposite the inlet. A label with instructions is fixed to a third side of the housing. The control panel comprises a ground fault test switch. The tester also comprises circuitry for testing the ground fault safety of the EVSE. An indicator denotes the presence and performance level accuracy of an incoming pilot signal. An indicator indicates the presence and performance level of an incoming proximity signal.

At least one indicator and indicia indicate the range of current that may be supplied from the EVSE under test when powered by a 220 VAC source. In addition, at least one indicator and indicia indicate that the range of current that may be supplied from the EVSE under test from a 110 VAC source. At least one indicator denotes the maximum current that, under test, the EVSE is capable of supplying to an electric vehicle. The indicators are preferably LEDs. The LEDs are activated to indicate whether or not the performance characteristics meet the corresponding specification. At least some of the indicators indicate approximate measured values of performance characteristics.

A tester for EVSE for charging a battery power supply of an electric vehicle comprises a housing with a control panel at an exterior location of the housing. The control panel has an electronic display and a plurality of switches. The EVSE connector inlet is disposed for access exteriorly of the housing. Circuitry comprising a microprocessor is disposed in the housing and is in communication with the inlet, the display and the switches. Upon connecting an EVSE connector to the inlet and selectively activating various switches, the circuitry simulates the battery power supply of the electric vehicle, and the display presents measurement values indicative of performance characteristics of the EVSE. The control panel is disposed opposite the inlet. The control panel comprises a ground fault test switch. The circuitry tests the ground fault safety of the EVSE. The circuitry is employed to measure quantitative characteristics of an incoming pilot signal. The circuitry is also employed to measure quantitative characteristics of an incoming proximity signal. The display indicates a range of current that may be supplied from the EVSE under test when powered from an AC power source.

A tester for EVSE for charging the batter power supply in an electric vehicle comprises a control panel accessible exteriorly of the housing. The control panel has a plurality of switches and an electronic alphanumeric display. An EVSE connector inlet is disposed for access exteriorly of the housing. Circuitry comprising a microprocessor is disposed in the housing in communication with the inlet, the switches and the display. Upon connecting an EVSE connector to the inlet and selectively activating switches, the circuitry simulates a battery power supply of an electric vehicle and activates a display to indicate various tests and to display performance characteristics of the EVSE which result from the tests. The performance characteristics comprise at least one characteristic selected from the group consisting of a signal level, voltage level and a pulse width.

BRIEF DESCRIPTION OF THE DRAWINGS

FIG. 5 is a perspective view schematically illustrating the connection of a representative J1772 connector for an EVSE installation and the EVSE tester of FIG. 1;

FIG. 6 is an enlarged annotated end view illustrating connections for the J1772 connector;

FIG. 8 is a table illustrating the 110 VAC current displayed on an EVSE tester and the minimum breaker size required for the electrical supply system for the EVSE;

Figure 1:
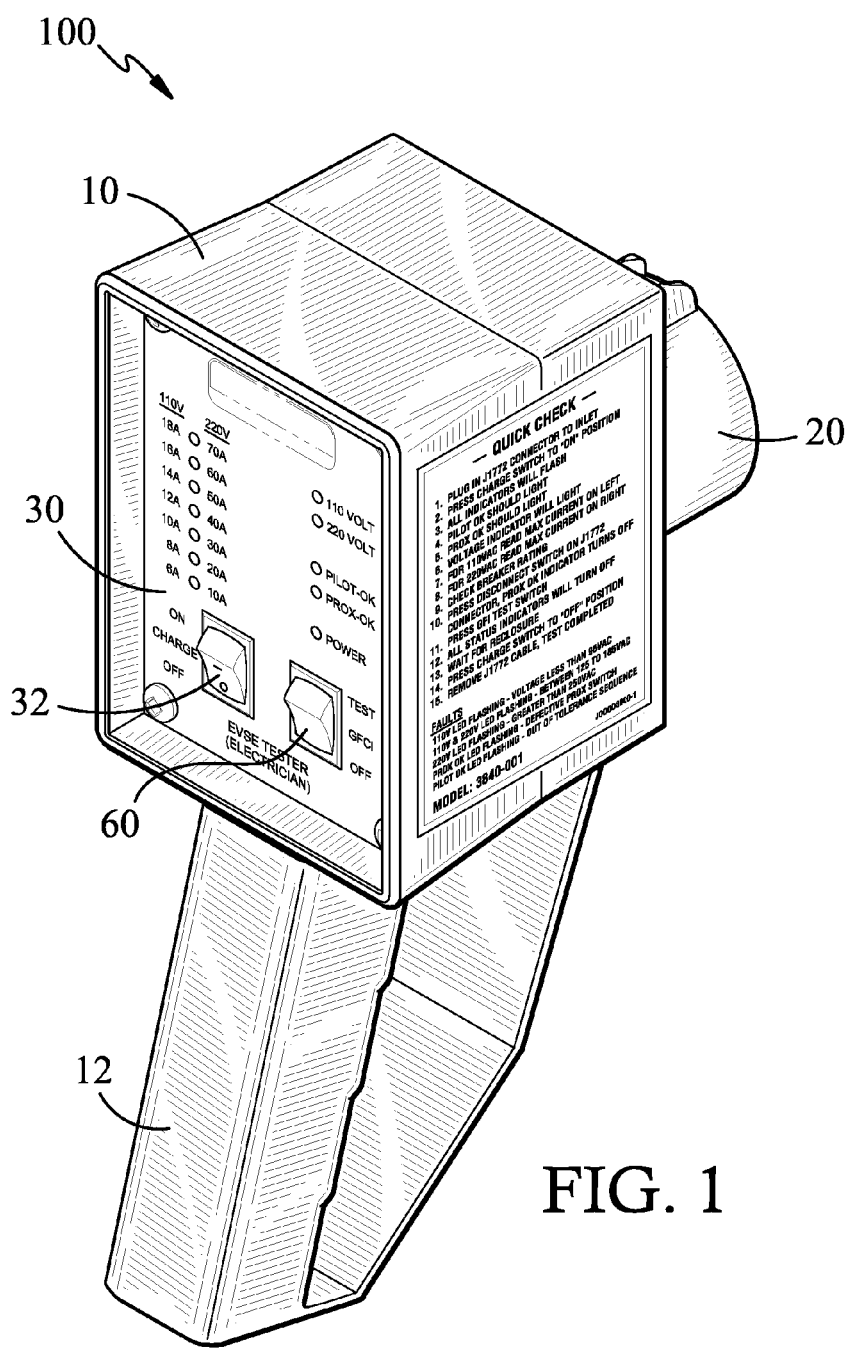
FIG. 1 is a perspective view of an EVSE tester.
Figure 10:
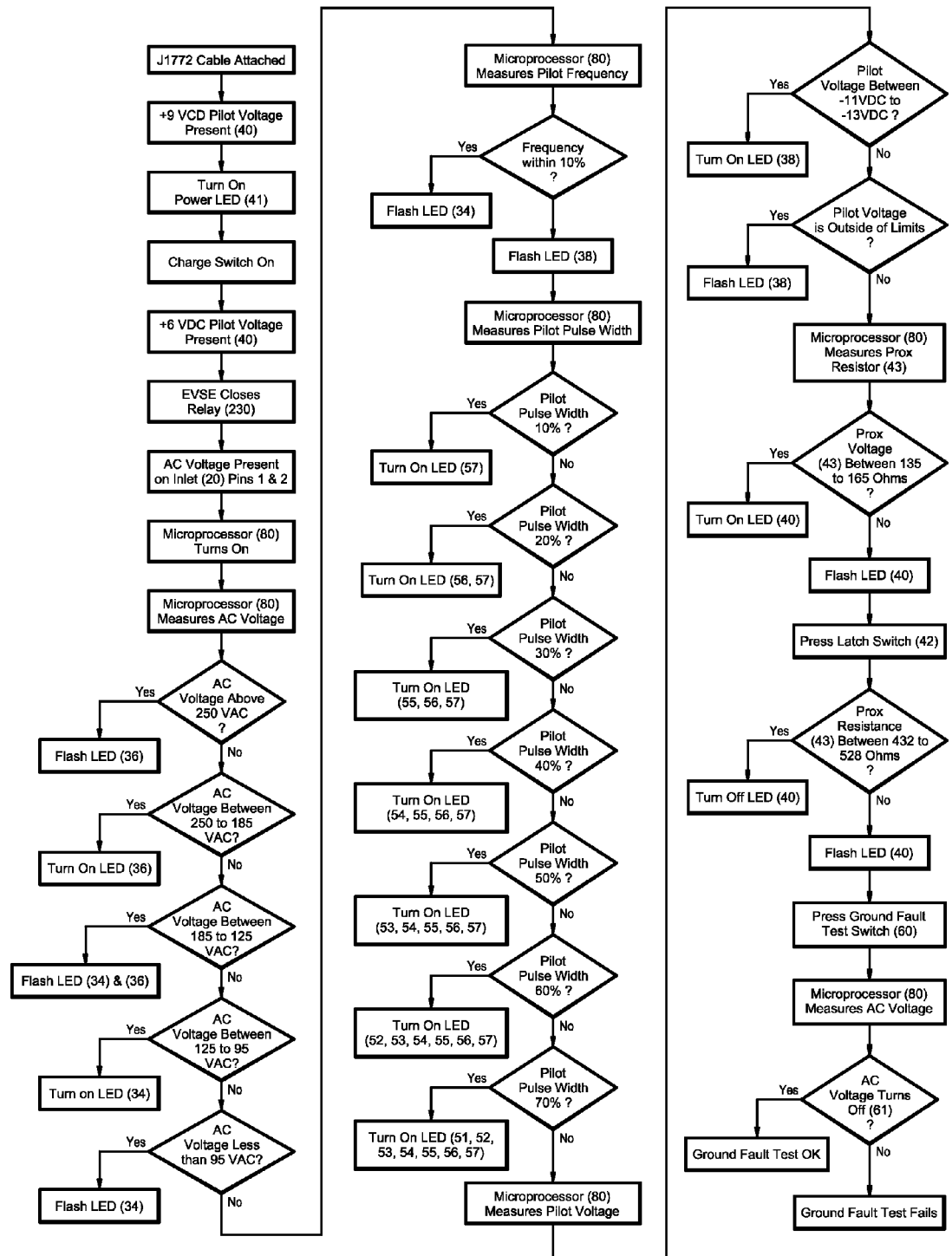
Figure 11:
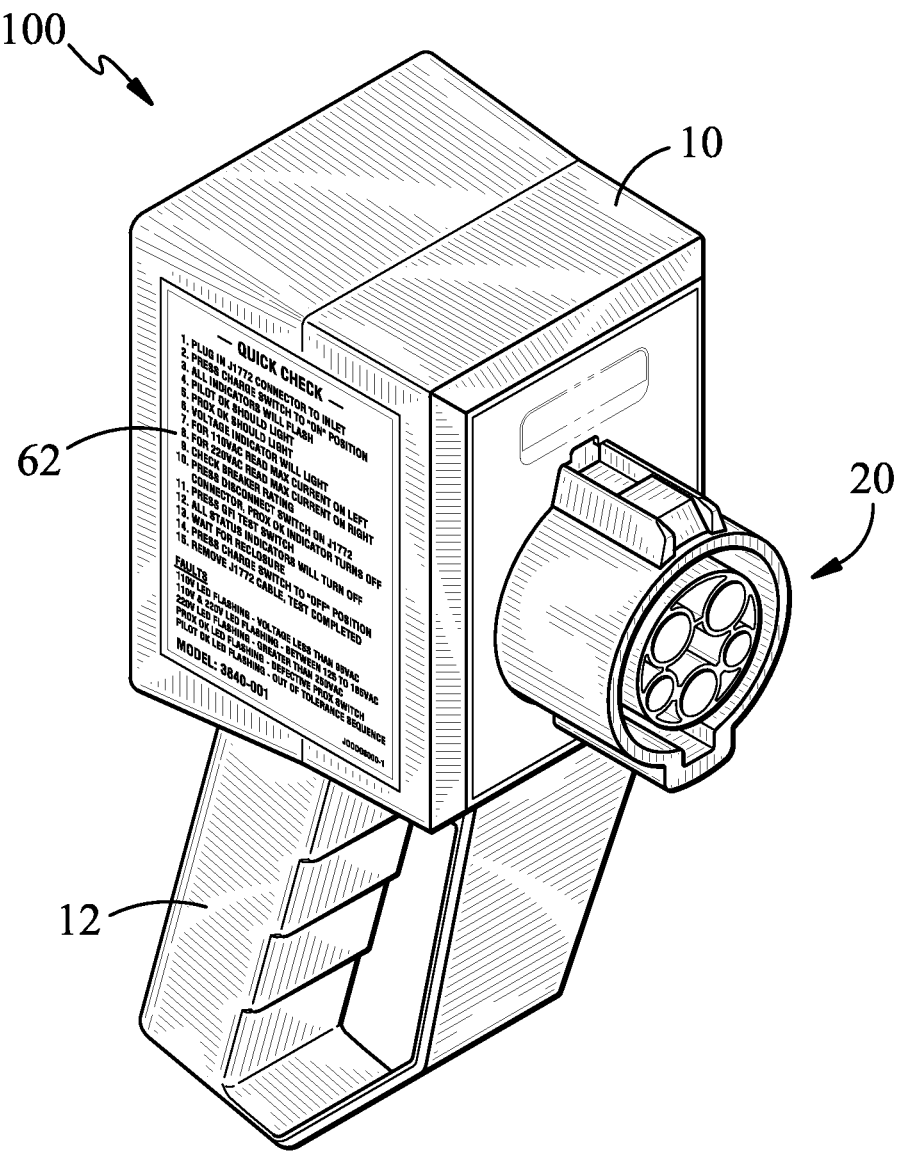
Figure 12:
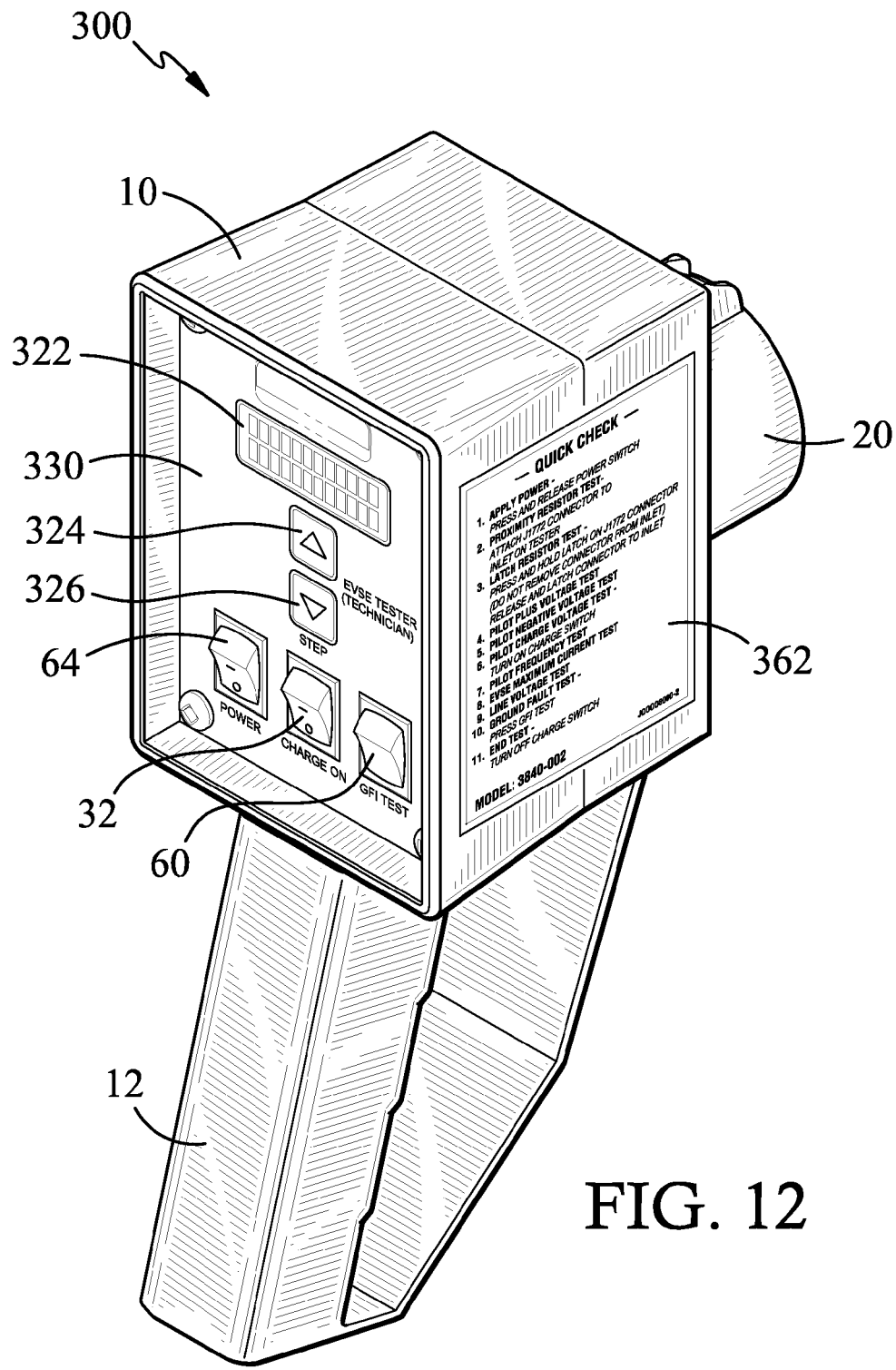
Figure 13:
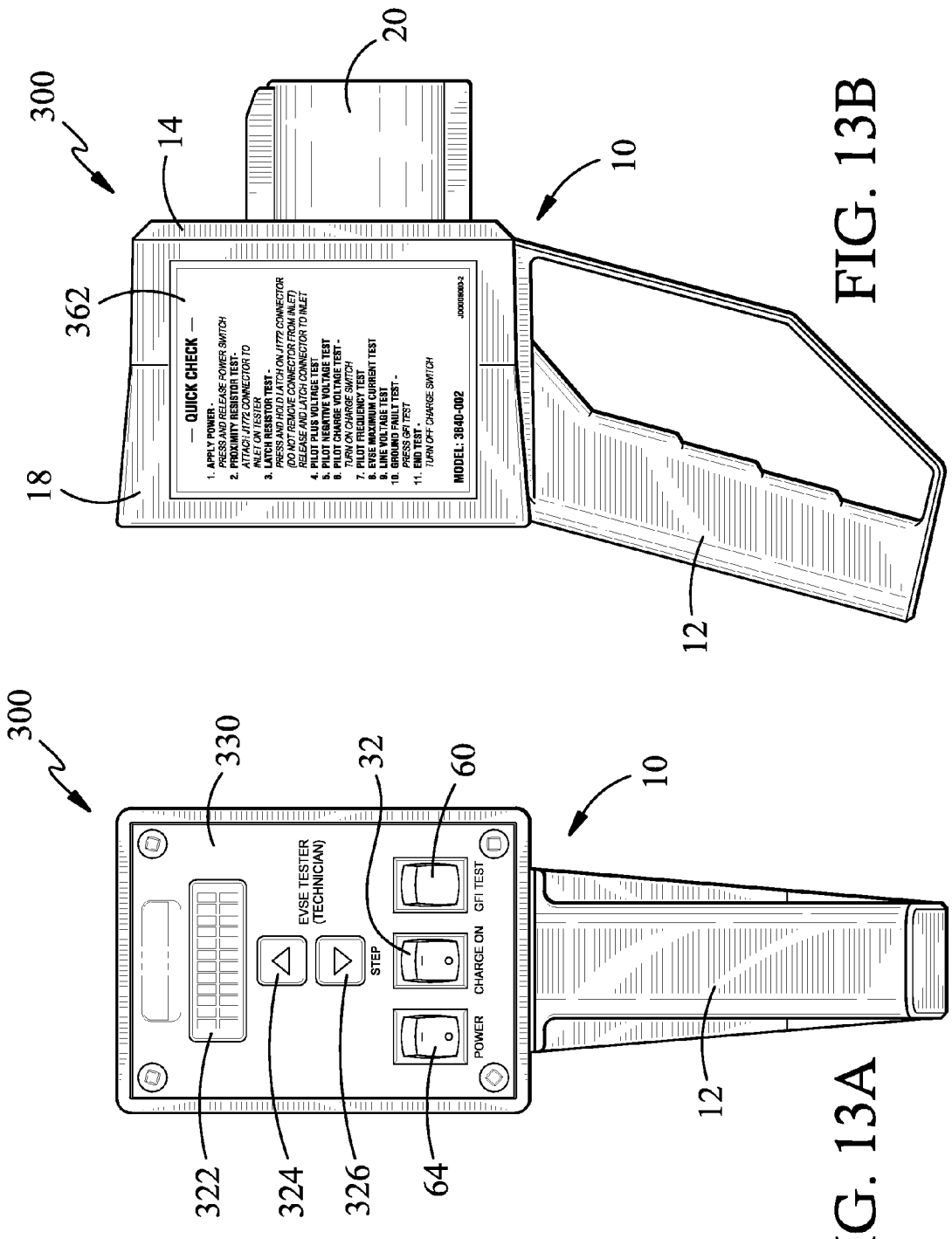
Figure 14:
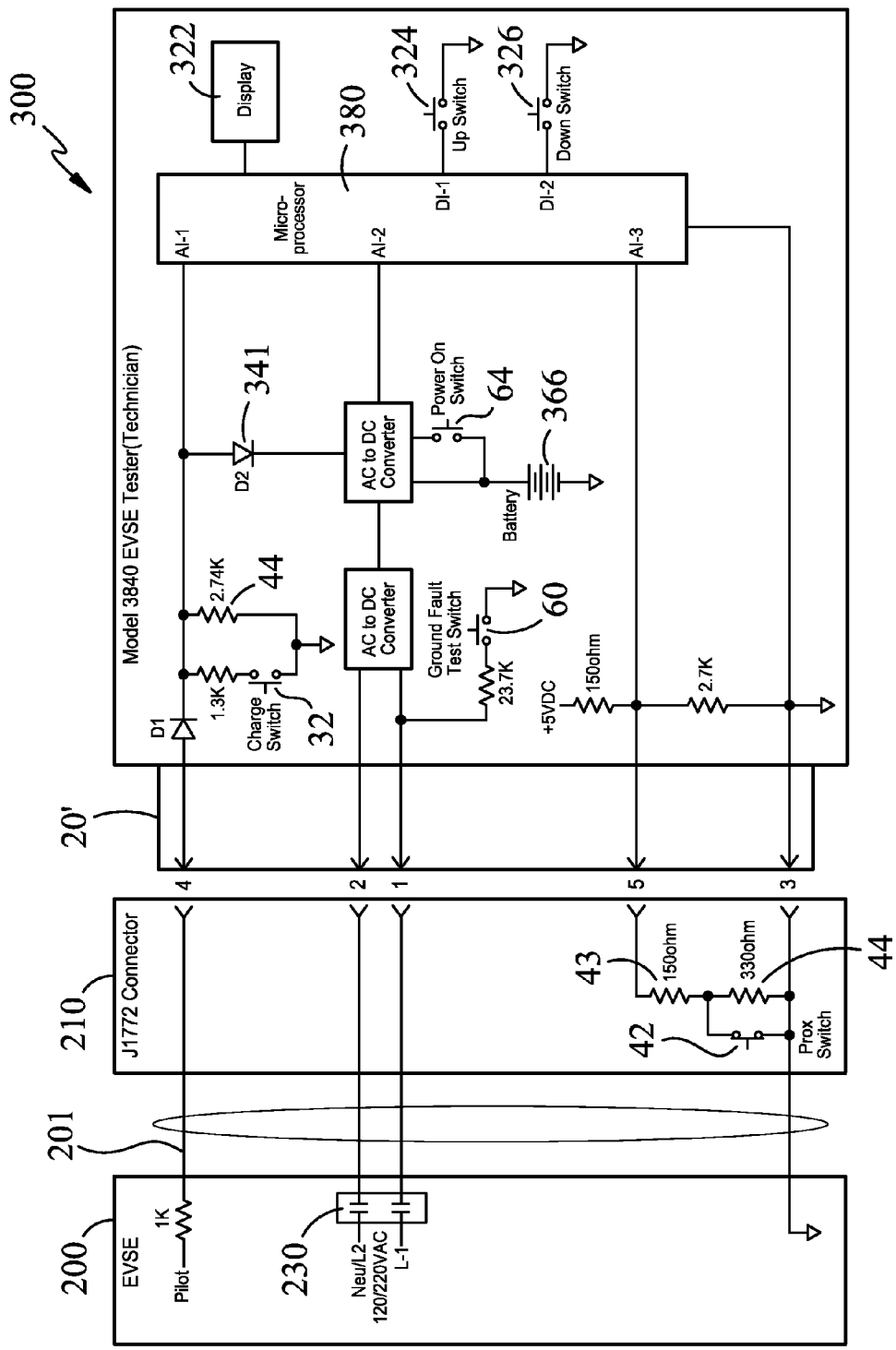
Figure 17:
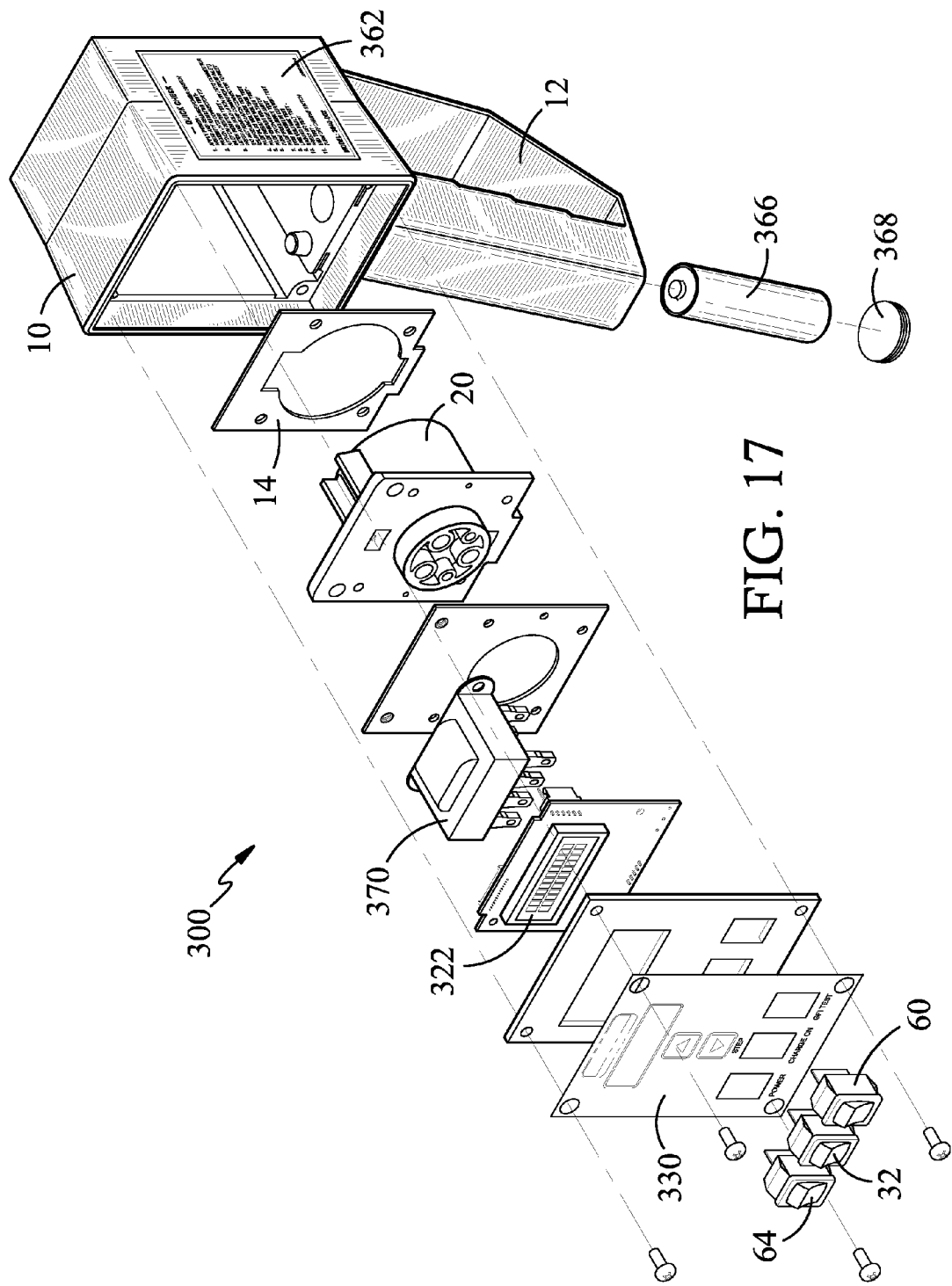
Figure 18:
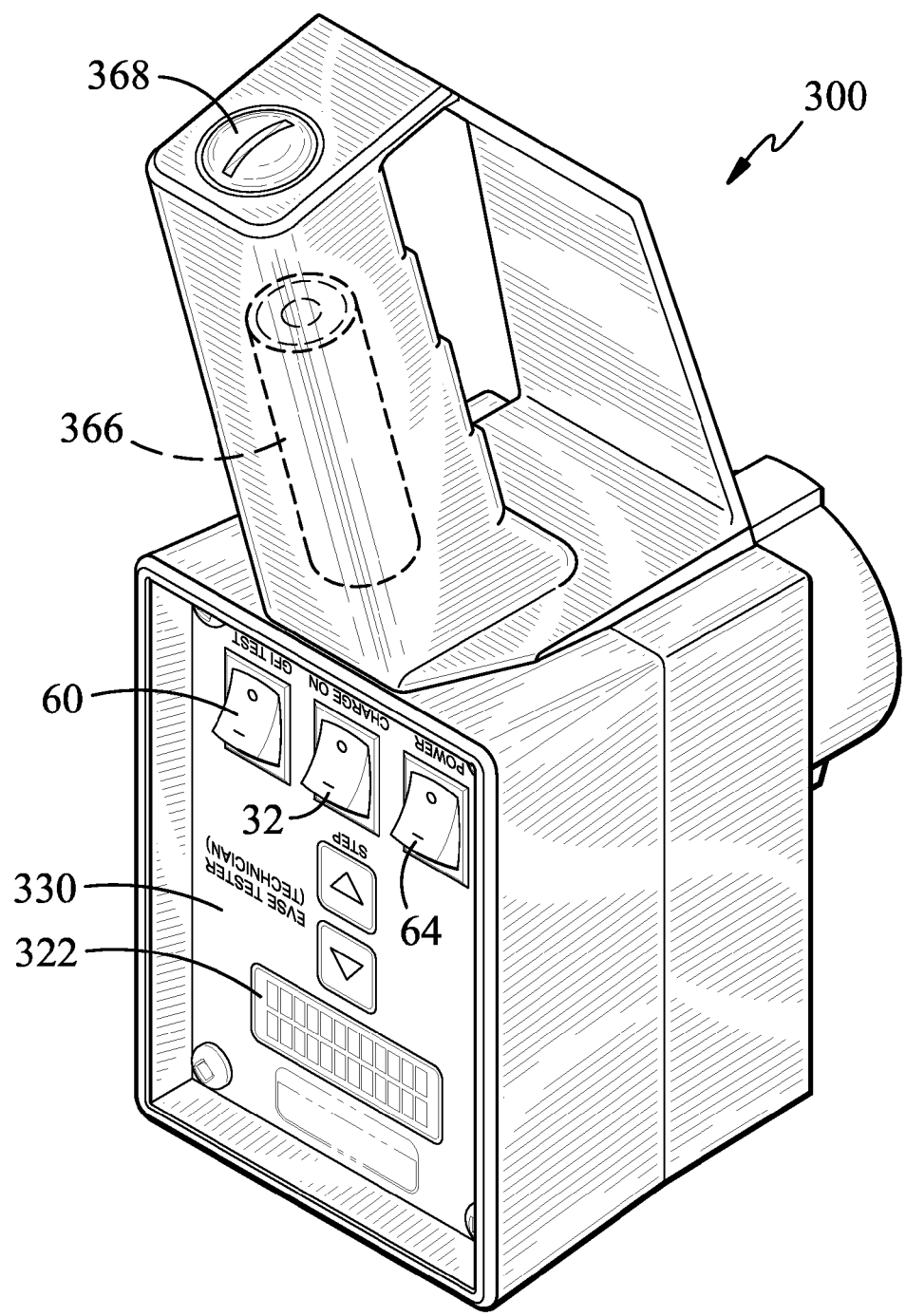
Figure 19:
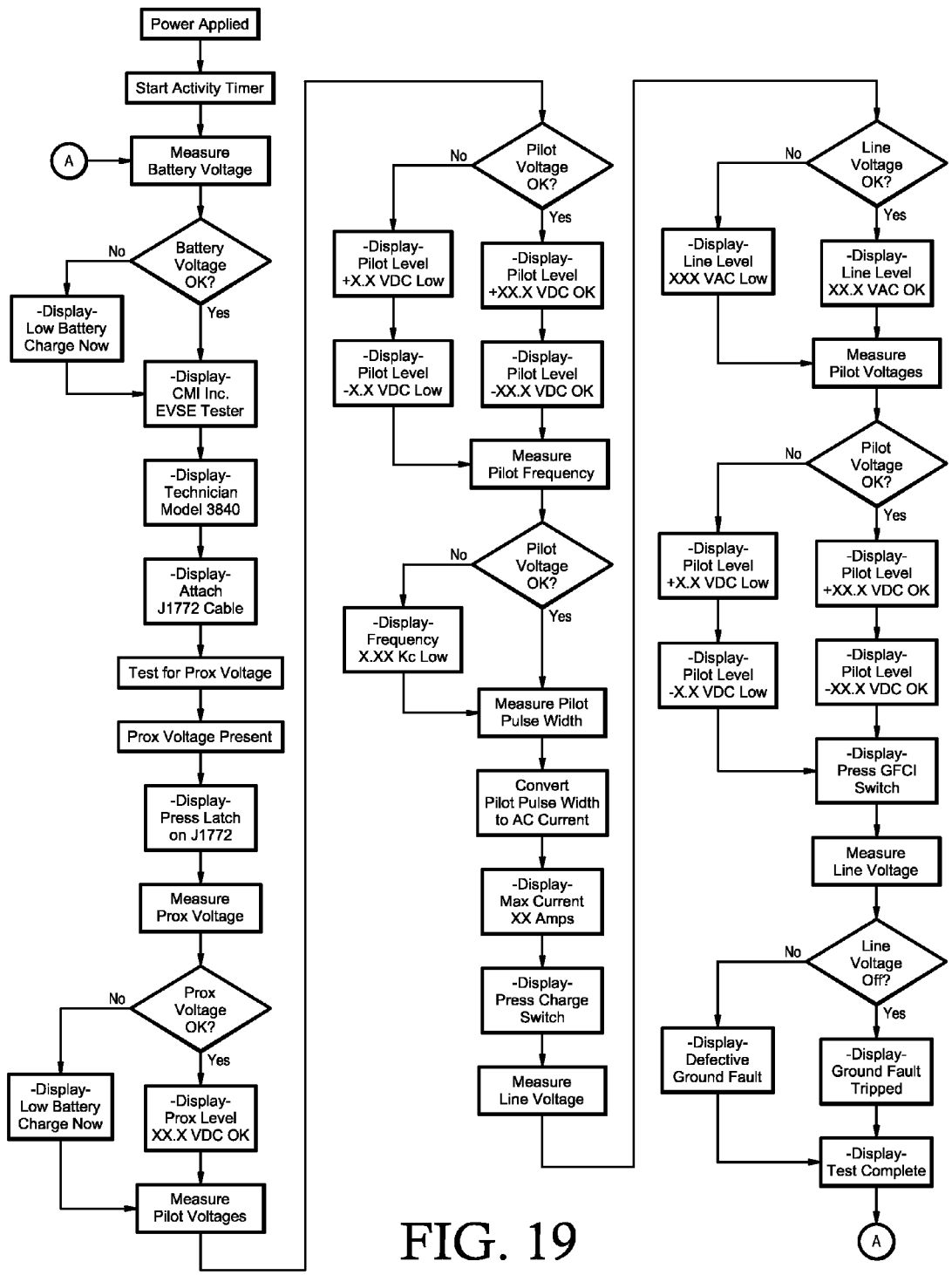

Table 9 is a table illustrating the 220 VAC current displayed on an EVSE tester and the minimum breaker size required for the EVSE electrical supply system for the EVSE;

FIG. 10 is an operational flow diagram of the EVSE tester of FIG. 1;

FIG. 11 is a perspective view of a second embodiment of an EVSE tester;

FIG. 12 is a perspective view of the EVSE tester of FIG. 11 taken from a generally opposite position thereof;

FIG. 13A is a front view and FIG. 13B a side view, partly in diagram form, of the EVSE tester of FIG. 12 disposed in side-by-side relationship;

FIG. 14 is a block diagram illustrating the EVSE tester of FIG. 12 and the EVSE, including a J1772 connector;

FIG. 15 is a perspective view schematically illustrating the connection of a representative J1772 connector for an EVSE installation and the EVSE tester of FIG. 12;

FIG. 16 is an enlarged view of an instruction plate which may be mounted to the side of the tester of FIG. 12 to aid in the usage of the tester by a technician;

FIG. 17 is an exploded perspective view of the EVSE tester of FIG. 12;

FIG. 18 is a generally bottom perspective view, partly in phantom, of the EVSE tester of FIG. 12 showing the location of the internal battery; and FIG. 19 is an operational flow diagram of the operation of the EVSE tester of FIG. 12.

DETAILED DESCRIPTION

With reference to the drawings wherein like numerals represent like parts throughout the Figures, an EVSE electrician tester is generally designated by the numeral 100 (FIG. 1) and an EVSE technician tester is generally designated by the numeral 300 (FIG. 11). The testers 100 and 300 are each a hand held test unit that simulates the battery power supply of an electric vehicle, and is used to test the operation and safety features of installed electric vehicle service equipment (EVSE).

Each tester evaluates compliance with applicable safety and performance standards and preferably, all of the standards specified by the Society of Automotive Engineers, J1772 publications. The testers 100 and 300 are designed to test any EVSE model that complies with the SAE J1772 standards. A representative EVSE is designated by the numeral 200 in FIGS. 3 and 14.

The testers 100 and 300 measure signal levels, pulse widths, and voltage levels generated by the EVSE 200 under test. The tester 100 indicates to the operator (electrician) the results of the measurements, using high intensity LEDs. The tester 300 indicates to the technician the results of various measurements, preferably using an alphanumeric display. Both testers 100 and 300 is a more sophisticade vice which the operator to test the important safety features, such as ground fault protection circuit, equipment grounding and the reclosure function.

Each tester is a hand held electric vehicle simulator designed to provide an efficient and user-friendly means of testing electric vehicle service equipment (EVSE) safety and operation or performance features without the presence of the electric vehicle.

The electrician tester 100 is powered when the EVSE applies power during the charge mode and requires no batteries. The technician tester 300 is powered by an internal battery 366 which is charged by either an external power pack or by the AC voltage present during the charge mode.

Each tester 100 and 300 (see FIGS. 1 and 11) employs a rugged sealed high impact plastic hand held enclosure 10 with a functionally downwardly protruding handle 12. A rear panel 14 is equipped with a rearward protruding SAE J1772 electric vehicle inlet 20. The battery 366 is mounted in the handle 12 of tester 300 and secured by an access cap 368 (FIG. 17).

Figure 2B:
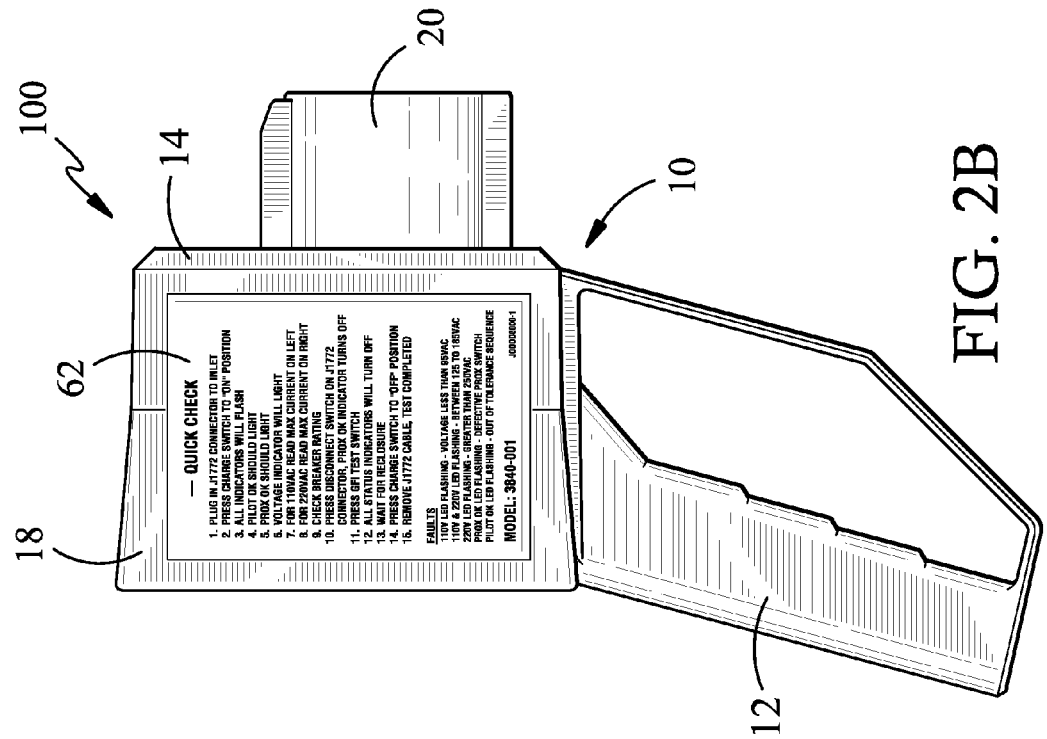
FIG. 2A is a front view and FIG. 2B a side view, partly in diagram form, of the EVSE tester of FIG. 1 disposed in side-by-side relationship.
Figure 2A:
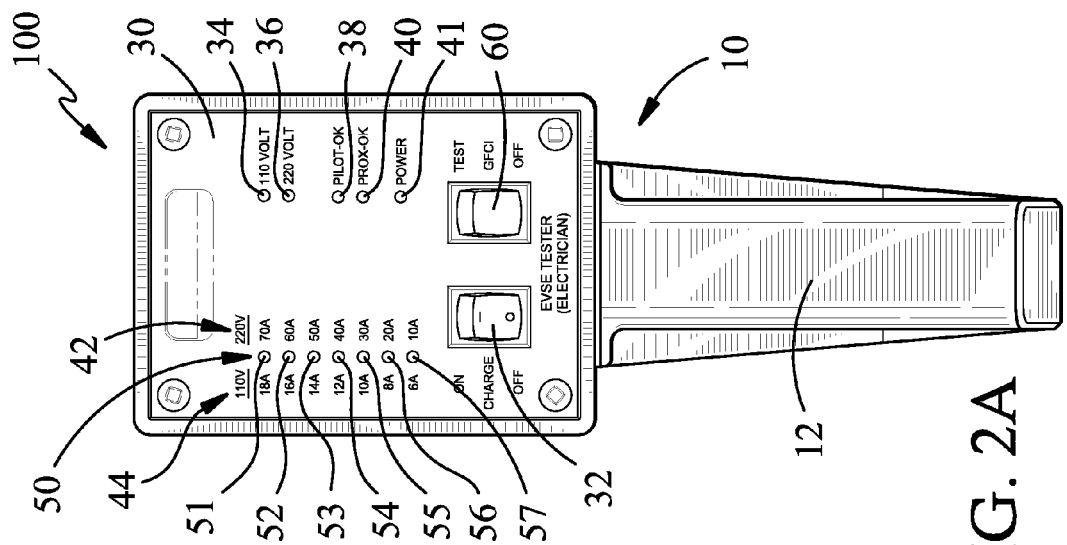

With additional reference to FIGS. 2A and 5, a frontal, readily accessible control panel 30 on the tester 100, interfaces with the electrician and has the following items:

A charge on/off toggle switch 32 activates the EVSE under test.

LED indicator 34 denotes when the input voltage is between 95 and 125 VAC.

LED indicator 36 denotes when the input voltage is between 185 and 250 VAC.

Pilot status LED indicator 38 denotes the presence and lower range accuracy of the incoming pilot signal.

Proximity switch status LED indicator 40 denotes the presence and lower range accuracy of the incoming proximity signal.

Column 42 indicates the range of currents that may be supplied to the electric vehicle from the EVSE under test, when powered from a 220 VAC source.

Column 44 indicates the range of currents that may be supplied to the electric vehicle from the EVSE under test when powered from a 110 VAC source.

Indicator set 50 of seven LED indicators 51-57 denotes the maximum current that the EVSE under test is capable of supplying to the electric vehicle. The value of this current is determined by the pulse width of the pilot signal received from the EVSE under test.

Ground fault (GFCI) momentary switch 60, which applies a 20 milli-amp leakage path from line 1 to ground, tests the ground fault safety feature of the EVSE under test.

Figure 4:
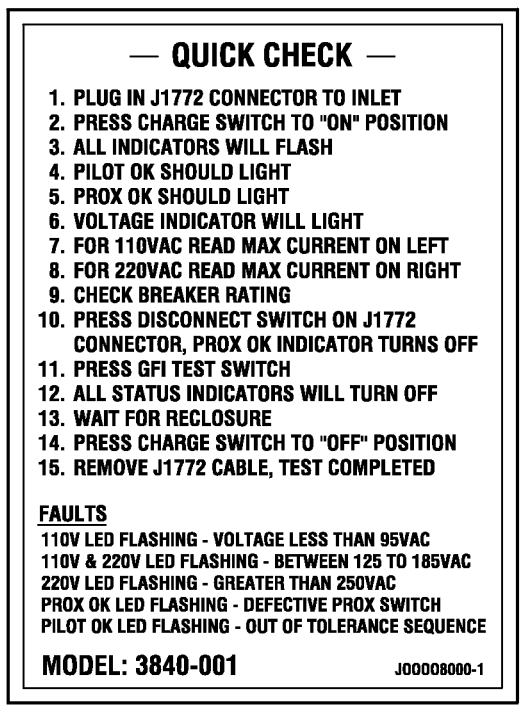
FIG. 4 is an enlarged view of an instruction plate which may be mounted to the side of the tester of FIG. 1 to aid in the usage of the tester by an electrician.
Figure 7:
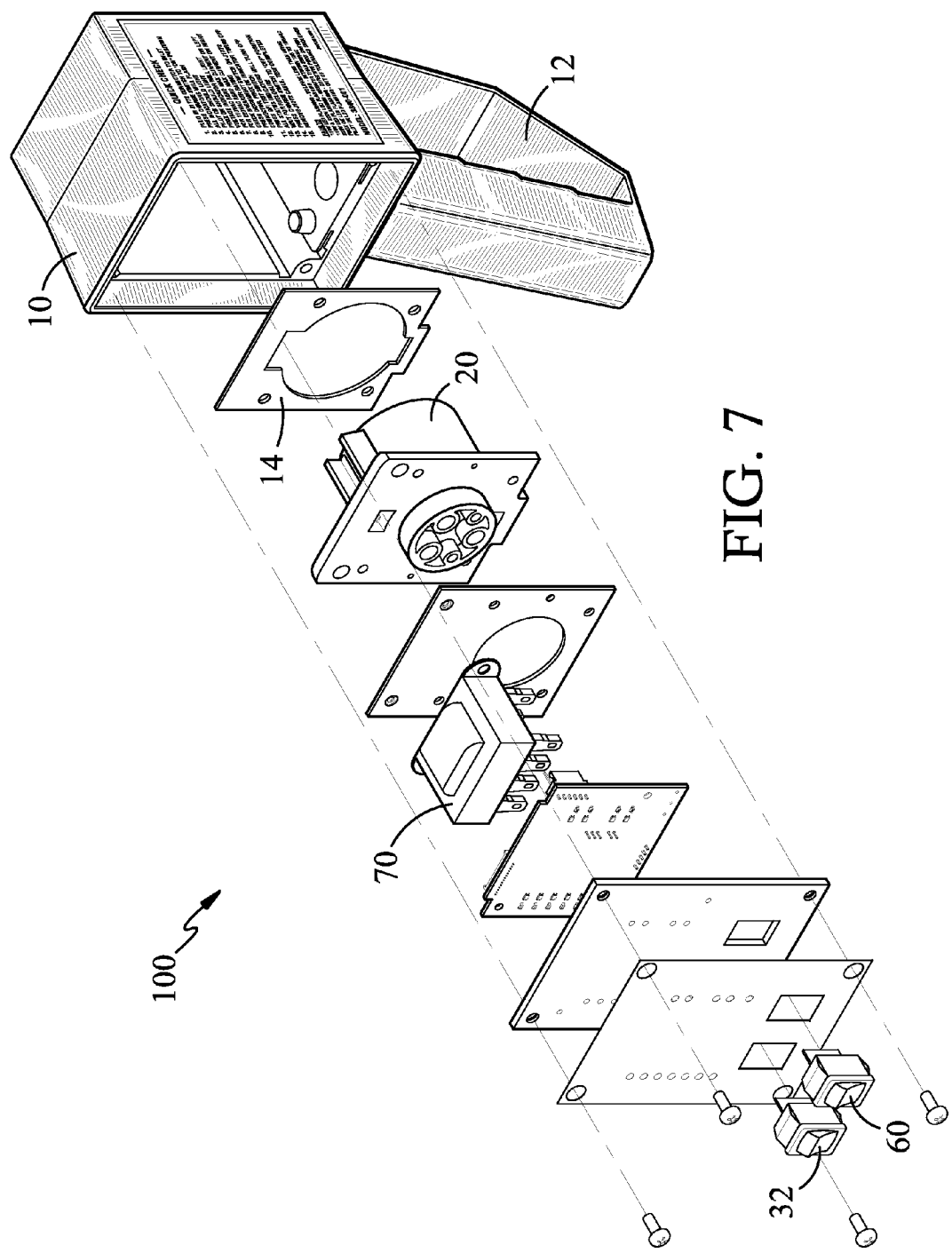
FIG. 7 is an exploded perspective view of the EVSE tester of FIG. 1.

A label 62 (FIG. 4) containing concise operating instructions is mounted to one side 18 of the housing 10.

Figure 3:
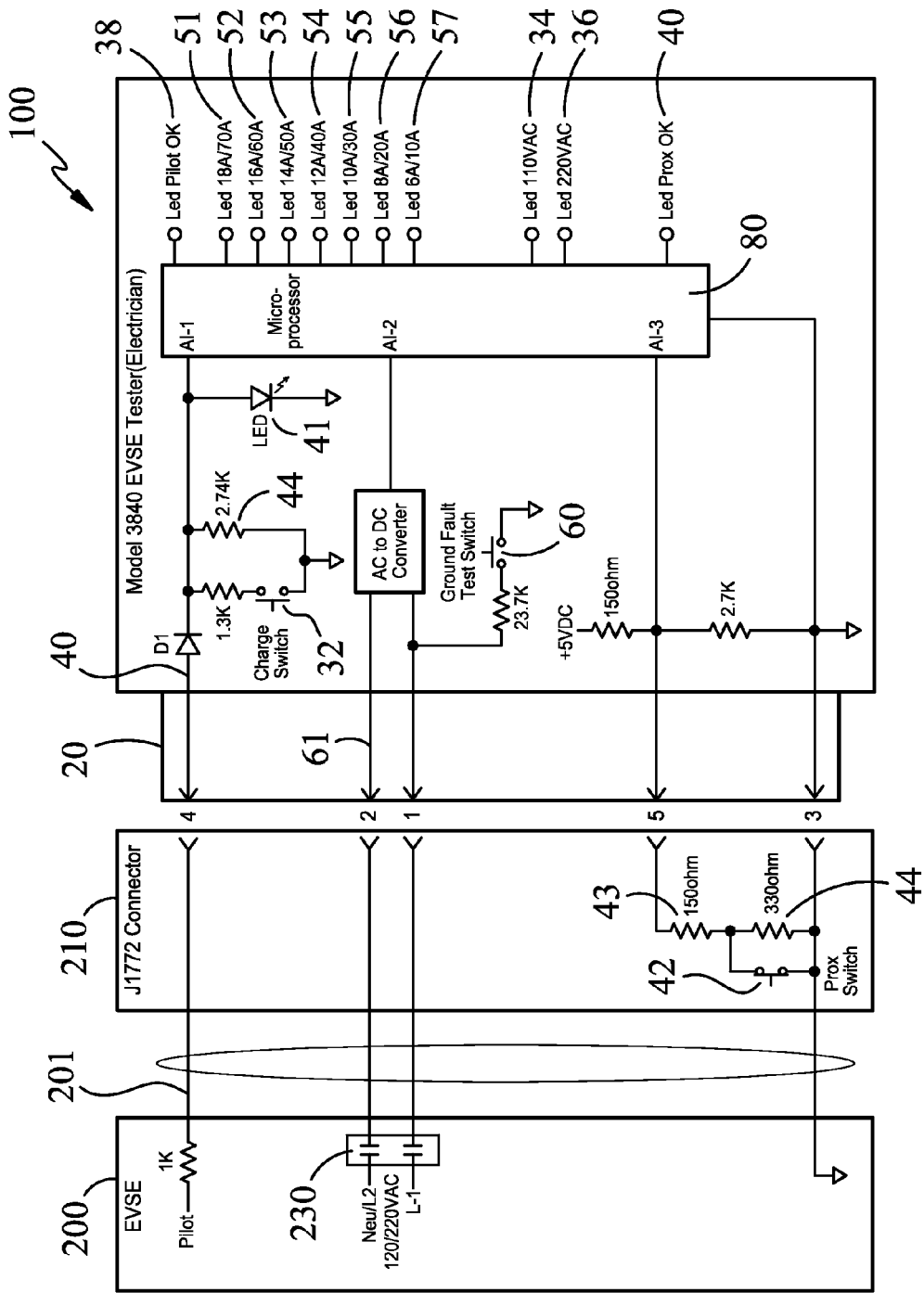
FIG. 3 is a block diagram illustrating the EVSE tester of FIG. 1 and the EVSE, including a J1772 connector.

With reference to FIG. 3 and FIG. 14, the EVSE testers 100 and 300 employ a transformer 70 and use an advanced microprocessor 80 and 380, respectively, developed for the automotive industry.

The microprocessor 80 of tester 100 performs the following functions:

Measures incoming line voltage from 0 to 250V AC.

Measures incoming pilot signal amplitudes up to +/−15V DC with 0.1% accuracy.

Measures pilot signal frequency (I kHz) with 0.1% accuracy.

Measures pilot signal pulse width, 0 to 95% duly cycle with 0.1% accuracy.

Measures the proximity switch 42 resistor with 0.1% accuracy.

Controls the 110V AC and 220V AC indicator LEDs 34 and 36.

Controls the pilot and proximity switch indicator LEDs 38 and 40.

Controls the seven current range indicator LEDs 50.

The microprocessor 380 of tester 300 performs the following functions:

Measures incoming line voltage from 0 to 250 VAC.
Measures incoming pilot signal amplitudes up to +/−15 VDC with 0.1% accuracy.
Measures pilot signal frequency (I kHz) with 0.1% accuracy.
Measures pilot signal pulse width, 0 to 95% duly cycle with 0.1% accuracy.
Measures the proximity switch 42 resistor with 1.0% accuracy.
Is controlled by the up and down sequence switches 324 and 326.
Senses when the charge switch 32 is on or off.
Measures the voltage of battery 366.
Indicates when the battery 366 is low.
Senses when a ground fault has occurred.
Turns off battery 366 power after a period of inactivity.
Displays sequentially all instructions, measurements, and status.

With additional reference to FIGS. 12, 13A and 15, a frontal, readily accessible control panel 330 interfaces with the technician and has the following items:

A power on toggle switch 64 activates the tester 300.
A charge on/off toggle switch 32 activates the EVSE 200 under test.
A ground fault (GFI) momentary switch 60, which applies a 20 milli-amp leakage path from line 1 to ground, tests the ground fault safety feature of the EVSE under test.
An alphanumeric display 322 indicates voltages, frequencies, resistance, currents measurements as well as in or out of tolerance boundaries.
The tester 300 has a label 362 (FIG. 16) containing concise operating instructions. The label 362 is mounted to one side 18 of the housing 10.

The tester 300 has an internal battery 366 (FIG. 18) used to power the tester when no AC power is supplied from the EVSE.

Operation of Electrician Tester 100

An EVSE 200 is tested by inserting the J1772 connector 210 of the EVSE 200 under test into the J1772 inlet 20 on the EVSE tester 100 (see FIG. 3).

When the J1772 connector 210 is inserted into the inlet 20, the pilot voltage on Pin 4 is reduced from +12 VDC to +9 VDC with respect to ground on Pin 3. This reduction in voltage, signals the EVSE, "under test", that the tester is connected. The EVSE in return will convert the +9 VDC signal to a +9 VDC/−12 VDC, 1 kHz, square wave signal. Some manufacturers supply EVSE without the −12 DCV bias, which "will be out of spec", but will still work with some electric vehicles. The pulse width of this square wave will vary, from 10% to 95%, depending on the amount of current that the EVSE can supply to the electric vehicle.

In addition, a 150 ohm resistor to ground, Pin 3, is connected to the proximity input, Pin 5, signaling to the tester 100 that the J1772 connector 210 is attached and locked. The EVSE tester 100 is now ready to test the EVSE 200.

When the charge switch 32, is toggled to the "On" position (closed contact), the pilot signal will decrease to +6 VDC peak. This action will signal the EVSE to close Relay 1 230 and apply either 120 VAC or 220 VAC to Pins 1 and 2 on the EVSE tester 100.

When AC power is applied to Pins 1 and 2 on the EVSE tester 100, the microprocessor 80 is activated and, as a self test, will sequentially light all of the status LEDs.

The microprocessor 80 will then measure the voltage on Pins 1 and 2 and depending on the amplitude, illuminate either the 110 VAC status LED 34 or the 220 VAC status LED 36. When the AC voltage is between 185 VAC and 250 VAC, the 220 V status LED 36 is turned on steady. When the AC voltage is between 95 VAC and 125 VAC, the 110 V status LED 34 is turned on steady. When the voltages are outside these ranges, the voltage LEDs 34 and 36 will flash (see fault conditions). The microprocessor 80 will also measure the amplitude and pulse width of the pilot signal. If the amplitude is within acceptable range, the maximum AC current available is determined by the microprocessor 80 and displayed by the current status LED indicators 51-57.

Based on the maximum current displayed on the tester 100, the electrician should ensure that the rating of the service breaker (not illustrated) is 1.25× the maximum current, i.e., 30 A displayed should be protected with a non GFCI, 40 A breaker (see the tables of FIGS. 8 and 9). The maximum current displayed by the tester 100 should never exceed the rating displayed on the EVSE name plate. The breaker rating should comply with all local and state electrical codes.

When the pilot signal is within the required J1772 specification, the pilot OK status LED 38 is turned on steady. Should the pilot signal not comply with the J1772 specification, the pilot LED 38 will flash indicating a problem (see fault conditions).

When the voltage, pilot and proximity status LEDs 34, 36, 38 and 40 are on steady, the last two tests may be completed.

The release latch 220 on the J1772 connector 210 (connector should not be removed from inlet on tester.) is activated at release button 222. The proximity OK status LED 40 should turn off when the release button is pressed (If not, see fault conditions.).

Next, the GFCI test monitoring toggle switch 60 is pressed to create a 20 ma leakage current to ground. This should cause the EVSE under test to drop AC power and indicate a ground fault condition (If not, see fault conditions.). All status LEDs on the EVSE tester 100 will then turn off.

Most EVSE manufacturers provide an automatic time-delayed reclosure after a ground fault interception. After the specified time delay, the EVSE 200 should once again supply voltage to the EVSE tester 100 (If not, see fault conditions.).

The EVSE test is now completed.

A summary of fault conditions for the EVSE Tester 100 is set forth in Table I.

TABLE I

| Action | Response | Problem |
| --- | --- | --- |
| Press Charge Switch "On" | No status LED | Check EVSE breaker Check EVSE power Check EVSE ground Check Pin 4 to ground Pin 3. Should be between +11 to +13 VDC |
|  | 110 V status LED flashes | Line voltage less than 95 VAC |
|  | 220 V and 110 V LED flash | Line voltage between 125 to 185 VAC |
|  | 220 V status LED flashes | Line voltage above 250 VAC |
|  | Pilot status LED OFF | Pilot frequency outside specification |
|  | Pilot status LED flashes (note 1) | Pilot voltage outside specification Check Pin 4 to ground Pin 3. Should be between +11 to +13 VDC |
| Press locking latch | Proximity status LED flashes | Locking latch not fully engaged Measure resistance between Pin 5 and ground Pin 3. |

TABLE I-continued

| Action | Response | Problem |
|--------|----------|---------|
|        |          | Should be 150 ohms and change to 480 ohms when lock latch is pressed |

Operation of the Technician Tester 300

With reference to FIGS. 14 and 19, when the power on switch 64 is pressed, the EVSE tester 300 FIG. 14, DC voltage is applied to the microprocessor 380 and associated circuits. The microprocessor 380 will first measure the voltage level of battery 66 and present its value on the display 322. When the voltage is nearing the discharged level, a low battery message is displayed.

When the battery voltage is adequate for operations, a sequence of identifying messages will be presented at display 322. A prompt message will be displayed instructing the operator (technician) to plug in the J1772 connector 210 into the J1772 inlet 20 on the tester 300.

When the J1772 connector 210 is inserted into the inlet 20, the pilot voltage on Pin 4 is reduced from +12 VDC to +9 VDC with respect to ground on Pin 3. If the power is not on, then this voltage will turn on the tester 300. This reduction in voltage signals the EVSE 200, "under test", that the tester 300 is connected. The EVSE in return will convert the +9 VDC signal to a +9 VDC/−12 VDC, 1 kHz, square wave signal. The pulse width of this square wave will vary, from 10% to 95%, depending on the amount of current that the EVSE can supply to the electric vehicle.

In addition, a 150 ohm resistor to ground, Pin 3, is connected to the proximity input, Pin 5, signaling to the tester 300 that the J1772 connector 210 is attached and locked. The EVSE tester 300 is now ready to test the EVSE 200.

A prompt message is displayed at display 322 to press the latch lever on 222 (FIG. 15), but not to remove the connector from the inlet. When the lever is pressed, a 330 ohm resistor 44 is connected in series with the 150 ohm resistor 43 which causes the pilot voltage to increase from 2.5 VDC to 4 VDC signaling that the latch 222 was pressed. This change in resistance and voltage level signals the electric vehicle to raise the voltage level of the pilot signal 201 which signals the EVSE 200 to open relay 230 which removes the voltage from connector 210, Pins 1 and 2.

The tester 300 will measure the 150 ohm resistor when the latch is not pressed and display its results. The tester 300 will also measure the resistance when the latch is pressed and again this value will be presented in the display 322.

To step to the next test, the operator uses the up arrow switch 324 on the tester 300. The operator may also use the down arrow 326 to step back to a previous test.

When the proximity switch test is completed, the operator steps to the pilot voltage test. In this step, the microprocessor measures the positive peaks of the pilot signal and presents the value and status in the display 322.

When the pilot plus voltage test is completed, the operator steps to the pilot negative voltage test by pressing the up switch 324. In this test the negative peak of the pilot will be measured and the value and status will be presented in the display.

When the pilot negative voltage test is completed, the operator advances to the pilot charge voltage test by pressing the up switch 324. The microprocessor will prompt the operator to press the charge switch 32 (FIGS. 12 and 14).

When the charge switch 32 is pressed, a 1.3 K resistor, which is connected to the pilot input, will be connected to ground causing the pilot signal to drop from +9 VDC to +6 VDC. This value will be measured by the microprocessor 380, and the voltage and its status presented on the display 322. This reduction in pilot voltage will also cause the EVSE, under test, to close its relay 230 which will apply the charge voltage on J1772 connector (20) on Pins 1 and 2.

One preferred embodiment of EVSE tester 300 has the features set forth in Table II:

TABLE II

| Feature: | Specification |
|----------|---------------|
| Compatibility: | Emulates all electric vehicles that comply with SAE J1772 standards |
| Inlet: | J1772 Compatible |
| Voltage Status: | Measures 0 to 250 VAC 0.1% accuracy |
| Pilot Signal: | Measures Frequency 1 kHz 0.1% accuracy Measures voltages +15 to −15 VDC 0.1% accuracy |
| Pilot Pulse Width: | Measures 10 to 90% duty cycle 0.1% accuracy |
| Proximity Signal: | Measures Voltages 0 to +5 VDC 0.1% accuracy |
| Current Display: | 220 V range—10 A to 70 A 110 V range—6 A to 18 A |
| Ground Fault Test: | 20 ma; Line 1 to ground |
| Compliance: | SAE J1772 |
| FCC Compliance: | FCC part 1 Class A |
| Line Safety: | Internal fuse |
| Environment: | ROHS compliant |
| Operating Temperature: | 0° to 122° F. (−20 C. ° to 50° C.) ambient |
| Operating Humidity: | 100% |
| NEMA Rating: | 4R |
| Material: | Bright yellow, high impact absorbent plastic |
| Drop Test: | 3' to hard surface |
| Weight: | 3 lb. |
| Size: | 3.37 ins. × 9.10 ins. × 5.94 ins. (FIGS. 13A and 13B) |

While preferred embodiments have been set forth for purposes of illustration, the foregoing description should not be deemed a limitation of the invention herein. Accordingly, various modifications, adaptations and alternatives may occur to one skilled in the art without departing from the spirit and the scope of the present invention.

The invention claimed is:

1. A tester for electric vehicle service equipment (EVSE) for charging the battery power supply of an electric vehicle comprising:
    a housing having a front and an opposite rear;
    a control panel disposed at said front and accessible exteriorly of said housing and comprising a switch and a plurality of indicators;
    an EVSE connector inlet extending outwardly from said rear disposed for access exteriorly of said housing and to connectively receive an EVSE connector; and
    circuitry comprising a microprocessor disposed in said housing and in communication with said inlet, said switch and said indicators;
    wherein upon connecting an EVSE connector to said inlet and activating said switch to an ON mode, said circuitry simulates the battery power supply of an electric vehicle and activates indicators indicative of performance characteristics of the EVSE.

2. The tester of claim 1 wherein the performance characteristics comprise at least one characteristic selected from the group consisting of a signal level, a voltage level and a pulse width.

3. The tester of claim 1 wherein said control panel is disposed opposite said inlet and a label with instructions is disposed at a third side of said housing.

4. The tester of claim 1 wherein said control panel comprises a ground fault test switch and further comprising circuitry for testing the ground fault safety of the EVSE.

5. The tester of claim 1 further comprising an indicator to denote the presence and performance level of an incoming pilot signal.

6. The tester of claim 1 further comprising an indicator to denote the presence and performance level of an incoming proximity signal.

7. The tester of claim 1 wherein at least one indicator and indicia indicate the range of current that may be supplied from the EVSE under test when powered from a 220 VAC source.

8. The tester of claim 1 wherein at least one indicator and indicia indicate the range of current that may be supplied from the EVSE under test when powered from a 110 VAC source.

9. The tester of claim 1 wherein at least one indicator denotes the maximum current that, under test, the EVSE is capable of supplying to an electric vehicle.

10. The tester of claim 1 wherein said indicators are LEDs.

11. The tester of claim 10 wherein said LEDs are activated to indicate whether or not the performance characteristics meet a specification.

12. The tester of claim 1 wherein at least some of said indicators indicate approximate measured values of performance characteristics.

13. A tester for electric vehicle service equipment (EVSE) for charging a battery power supply of an electric vehicle comprising:
   a housing having a front and an opposite rear and a lower surface;
   a control panel accessible exteriorly at said front of said housing and comprising an electronic display and a plurality of switches;
   an EVSE connector inlet which connects with an EVSE connector extending outwardly from said rear and disposed for access exteriorly of said housing;
   circuitry comprising a microprocessor disposed in said housing and in communication with said inlet, said display and said switches; and
   a handle extending from said lower surface;
   wherein upon connecting an EVSE connector to said inlet and selectively activating various switches, said circuitry simulates the battery power supply of an electric vehicle and said display generates measurement values indicative of performance characteristics of the EVSE.

14. The tester of claim 13 wherein said control panel is disposed opposite said inlet.

15. The tester of claim 13 wherein said control panel comprises a ground fault test switch and wherein said circuitry tests the ground fault safety of the EVSE.

16. The tester of claim 13 wherein said circuitry is employed to measure quantitative characteristics of an incoming pilot signal.

17. The tester of claim 13 wherein said circuitry is employed to measure quantitative characteristics of an incoming proximity signal.

18. The tester of claim 13 wherein said display indicates the range of current that may be supplied from the EVSE under test when powered from an AC power source.

19. A handheld tester for electric vehicle service equipment (EVSE) for charging the battery power supply of an electric vehicle comprising:
   a housing;
   a control panel accessible exteriorly of said housing and comprising a plurality of switches and an electronic alphanumeric display;
   an EVSE connector inlet connectable with an EVSE connector and disposed for access exteriorly of said housing opposite said control panel;
   circuitry comprising a microprocessor disposed in said housing and in communication with said inlet, said switches and said display and;
   a rigid handle extending from said housing
   wherein upon connecting an EVSE connector to said inlet and selectively activating said switches, said circuitry simulates the battery power supply of an electric vehicle and activates said display to indicate various tests and to display performance characteristics of the EVSE which result from said tests.

20. The tester of 19 wherein the performance characteristics comprise at least one characteristic selected from the group consisting of a signal level, a voltage level and a pulse width.

* * * * *